United States Patent [19]
Chow et al.

[11] Patent Number: 5,850,159
[45] Date of Patent: Dec. 15, 1998

[54] HIGH AND LOW SPEED OUTPUT BUFFER WITH CONTROLLED SLEW RATE

[76] Inventors: Hwang-Cherng Chow, 4F, No. 28, San Chung Road, Chutung, Hsinchu, Taiwan, 310; Chen-Yi Huang, 5F, No. 177-9, Tung-Si St., Hsinchu; Tain-Shun Wu, No. 104, 3 Ling, Pei-Log, Honu-Long, Miou-Lee, both of Taiwan

[21] Appl. No.: 854,393

[22] Filed: May 12, 1997

[51] Int. Cl.$^6$ ................................................. H03K 17/296
[52] U.S. Cl. ........................ 327/394; 327/170; 327/404; 327/393; 326/83; 326/87
[58] Field of Search ................................. 326/17, 26, 27, 326/83, 87; 327/170, 172, 175, 108, 109, 111, 112, 374, 393, 394, 395, 396, 398, 399, 401, 403, 404, 434

[56] References Cited

U.S. PATENT DOCUMENTS

| | | | |
|---|---|---|---|
| 4,421,994 | 12/1983 | Puri et al. | 327/112 |
| 5,391,939 | 2/1995 | Nonaka | 326/83 |
| 5,708,386 | 1/1998 | Chow | 327/380 |
| 5,717,343 | 2/1998 | Kwong | 326/27 |

*Primary Examiner*—Timothy P. Callahan
*Assistant Examiner*—Jung Ho Kim
*Attorney, Agent, or Firm*—Proskauer Rose LLP

[57] ABSTRACT

An output buffer is provided which receives an input signal for output onto an output terminal. The output buffer has a first driver and a second driver for driving the output terminal to a voltage corresponding to a logic value of the input signal. The second driver has a higher driving capacity than the first driver. The output buffer also has control circuitry receiving a transition in logic value of the input signal and at least one mode signal. The control circuitry responds to the transition in logic value by delaying the second driver from driving the output terminal to a complementary voltage until after the first driver begins to drive the output terminal to the complementary voltage. In so doing, the control circuitry delays the second driver by a first delay, when the mode signal(s) indicates a full speed mode. On the other hand, the control circuitry delays the second driver by a second delay, that is longer than the first delay, when the mode signal(s) indicates a low speed mode.

14 Claims, 7 Drawing Sheets

HIGH AND LOW SPEED OUTPUT BUFFER WITH CONTROLLED SLEW RATE

RELATED APPLICATIONS

This application is related to the following patent application: U.S. patent application Ser. No. 08/855,844, entitled "High Drive CMOS Output Buffer with Fast and Slow Speed Controls," filed on even date herewith for Hwang-Cherng Chow. The above-listed patent applications are assigned to the same assignee as this application and are incorporated herein by reference.

FIELD OF THE INVENTION

The present invention relates to integrated circuit design and in particular to output buffers of integrated circuits.

BACKGROUND OF THE INVENTION

Output drivers are a class of circuits used, for example in integrated circuit (IC) chips, for purposes of driving a load with a high current drive. Generally speaking, small current driving transistors are used internally in the IC chip but cannot drive a heavy load. Output drivers are provided for outputting such signals externally from the IC with a high current driving capability and therefore can drive a heavy load. As such, output driver circuits are often referred to as "output buffers."

To achieve a high current drive, output buffers typically contain large MOSFET or MOS transistors. (Herein, as per common usage in the art, MOSFET or MOS refer to any insulated gate field effect transistors, preferably polycrystalline silicon gate field effect transistors, and not only metal oxide semiconductor field effect transistors.) Such large transistors present a noise problem for the IC. In particular, the output buffer transistors are connected to a high voltage $V_{DD}$ power supply bus and a low voltage $V_{SS}$ power supply bus. The output buffer transistors capacitance. During a high speed transition in logic value, the large output buffer transistors can produce a high current. This high current, in turn, can impress a noise voltage on the low and high power supply buses as a result of bonding wire, packaging and other inductances. (Note that the impressed voltage is given by v=L •di/dt, where v is the noise voltage, L is the inductance of the bonding wire, packaging, etc., and di/dt is the derivative of the current generated by the large driver transistors of the output buffer with respect to time. Thus, the more rapidly that the current of the large driver transistors of the output buffer varies in time, the larger the magnitude of the impressed noise signal.) This undesirable noise voltage on the high and low power supply buses is commonly referred to as "ground bounce."

A number of prior art solutions have been proposed to reduce "ground bounce" in output buffers. Of interest is a prior art output buffer 10 shown in FIG. 1 and disclosed in U.S. Pat. No. 4,987,324. As shown, a low current drive driver A and a high current drive driver B are provided for driving the output terminal pad T. The driver A is formed by a PMOS transistor Q1A and an NMOS transistor Q2A connected in a "push-pull inverter" configuration. Specifically, the PMOS transistor Q1A has its source connected to the high voltage $V_{DD}$ power supply bus, its drain connected to the output terminal pad T and its gate connected to an input. The transistor Q2A has its source connected to the low voltage $V_{SS}$ power supply bus, its drain connected to the drain of the transistor Q1A and to the output terminal pad T and its gate connected to the gate of transistor Q1A and the input. The connections of the sources of the transistors Q1A and Q2A to the high voltage $V_{DD}$ and low voltage $V_{SS}$ power supply buses, respectively, provide high voltage and low voltage biasing of the driver A with the high voltage $V_{DD}$ (e.g., 5 volts) and the low voltage $V_{SS}$ (e.g., ground or 0 volts). The driver A drives its output to a voltage which is a complement of the voltage inputted to its input. A predriver inverter E is provided which receives an input signal Vi and outputs a complement of the signal Vi to the input of the driver A.

The driver B is also an inverter formed from the PMOS transistor Q1B and the NMOS transistor Q2B which have their drains connected to the output terminal pad T. The source of the transistor Q1B is connected to the high voltage $V_{DD}$ power supply bus and the source of the transistor Q2B is connected to the low voltage $V_{SS}$ power supply bus. Unlike the driver A, the driver B has two predriver inverters C and D. The inverter C receives the input signal Vi and outputs the complement of this signal to the gate of the transistor Q1B. The inverter D receives the input signal Vi and outputs the complement of this signal to the gate of the transistor Q2B.

During steady-state operation, when the input signal Vi is a logic '0' (low voltage level $V_{SS}$), the inverters E, D and C each output a logic '1' value (high voltage level $V_{DD}$) to the inputs of the transistors Q1A, Q2A, Q1B and Q2B. Transistors Q1A and Q1B, being PMOS transistors, are off and transistors Q2A and Q2B, being NMOS transistors, are on. As such, the transistors Q2A and Q2B both sink any current on the output terminal pad T to the low voltage $V_{SS}$ power supply bus, thereby maintaining the voltage level of the output terminal pad T at $V_{SS}$. On the other hand, when the input signal Vi is a logic value '1' (high voltage level $V_{DD}$), the inverters C, D and E output a logic value '0' (low voltage level $V_{SS}$). The transistors Q2A and Q2B, being NMOS transistors, are off and transistors Q1A and Q1B, being PMOS transistors, are on. As such, the transistors Q1A and Q1B supply a current to the output terminal pad T, thereby maintaining the voltage level of the output terminal pad T at $V_{DD}$.

As noted above, ground bounce is an effect that occurs during a transition in logic value, i.e., from logic '0' to logic '1', or logic '1' to logic '0', of the input signal Vi (which results in a transition in corresponding voltage level of the output terminal pad T from $V_{SS}$ to $V_{DD}$ or from $V_{DD}$ to $V_{SS}$, respectively). To reduce ground bounce, the driver A is provided with smaller sized (i.e., smaller channel width) transistors Q1A and Q2A than the transistors Q1A and Q2B provided in the driver B. Furthermore, the logic threshold voltages or switching voltages of the inverters C, D and E are selected to cause each inverter to switch, i.e., transition its output voltage, at a different time. This can be better understood with reference to FIG. 2. Suppose that the switching voltages of the inverters C, D and E are chosen to be 3.7, 1.1 and 2.5 volts, respectively. As shown, the input signal Vi begins to transition from logic '0' (voltage level $V_{SS}$=0) to logic '1' (voltage level $V_{DD}$=5) at time t0. At time t1, the voltage level of Vi reaches 1.1 volts thereby triggering inverter D to transition its output from logic value '1' to logic '0'. As a result, Q2B begins to turn off. At time t2, the voltage Vi reaches 2.5 volts thereby triggering inverter E to transition its output logic value from '1' to '0'. As a result, Q1A begins to turn on and Q2A begins to turn off. Finally at time t3, Vi reaches 3.7 volts thereby triggering inverter C to transition its output logic value from '1' to '0'. As a result, Q1B begins to turn on. The net effect is that first Q2B turns off at time t1, then Q1A turns on while Q2A turns off at time t2, followed by Q1B turning on at time t3. Thus, the turn on of the larger PMOS transistor Q1B is delayed until after the smaller PMOS transistor Q1A turns on. This is advantageous because the smaller transistor Q1A has a lower current driving capability. Initially, when Q1A turns on, the voltage of the output terminal pad is 0. The transistor Q1A slowly charges up the output terminal pad. Because of the limited current drive of the transistor Q1A and the relatively slow voltage change of the output terminal pad T, little ground bounce is produced. Later, the transistor Q1B turns on with a higher current drive capability. However, at this point, the output terminal pad is partially charged and therefore a rapidly changing current drive is avoided, despite the output terminal pad T being driven by a high current drive transistor Q1B. Because a rapid current change is avoided, ground bounce is suppressed.

Likewise, when the input signal transitions from logic '1' to logic '0', the inverters change their outputted logic values from logic '0' to logic '1' successively in the order of inverter C first, followed by inverter E followed by inverter D. The net effect is that Q1B turns off first, then Q1A turns off and Q2A turns on followed finally by Q2B turning on. Because smaller transistor Q2A turns on first, it begins to slowly discharge the output pad T with its (relatively) low current drive capability. Then, larger transistor Q2B turns on. However, the output terminal pad T is already partly discharged. Thus, Q2B drives the output terminal pad T with a less rapidly changing current. Again, ground bounce is reduced.

While the output buffer 10 can suppress ground bounce, it is not suitable for all applications. For example, in certain applications, the current drive capacity of both the small and large drivers is relatively high. For example, to achieve a requisite current drive in some applications, the transistor Q1A may have a channel width of 200 μm and the transistor Q1B may have a channel width of 1000 μm. As indicated in FIG. 2, during a transition, both transistors Q1A and Q2A are simultaneously on. This produces a short circuit path between the high power supply bus and the low power supply bus. If the transistors Q1A and Q2A are large, then a high short circuit current may be produced which damages the IC.

Second, consider an example where Q1B has a channel width of 800 μm and Q2B has a channel width of 400 μm. During a transition in input signal Vi logic value from '0' to '1', the delay in turn on time between transistors Q1B and Q1A is controlled by the relative switching voltages of predrivers E and C. Likewise, during a transition in input signal Vi logic value from '1' to '0', the delay in turn on time between the transistors Q2B and Q2A is controlled by the relative switching voltages of predrivers E and D. However, such delays are not sufficient to reduce ground bounce in certain applications for such large transistors Q1B and Q2B.

FIG. 3 shows a low speed output buffer 20 proposed by Intel™, a semiconductor manufacturer located in Santa Clara Calif. An output pad Dx is selectively driven by PMOS pull-up driver transistor P4', having a source connected to the high voltage $V_{DD}$ power supply bus and a drain connected to the output pad Dx, or NMOS pull-down driver transistor N4' having a source connected to the low voltage $V_{SS}$ power supply bus and a drain connected to the output pad Dx. PMOS quick turn off transistor P3' receives a signal P_EN#. When P_EN# is logic '0', P3' turns on and drives the gate of P4' to the high voltage level $V_{DD}$ thereby turning off P4'. Otherwise, when P_EN# is logic '1', P3' is off and does not drive the gate of P4' to any voltage level. Likewise, NMOS quick turn off transistor N3' receives a signal N_EN#. When N_EN# is logic '1', N3' quickly turns on and drives the gate of N4' to the low voltage level $V_{SS}$, thereby turning off N4'. Otherwise, when N_EN# is logic '0', N3' is off and does not drive the gate of N4' to any voltage level.

Connected to the gates of P4' and N4' are analog differential amplifiers 22 and 24, respectively. The amplifier 22 receives the signal P_EN# as an enable signal and the amplifier 24 also receives the signal N_EN# as an enable signal. The positive (noninverting) inputs of each amplifier 22 and 24 are connected together. Each amplifier 22 and 24 receives a signal CNTR at a negative (inverting) input. The voltage level of CNTR is selected to cause amplifiers 22 and 24 to selectively output a low or negative voltage or high or positive voltage, depending on the voltage applied to the positive inputs (as described in greater detail below). Also connected to the positive inputs of the amplifiers 22 and 24 is the drain of a PMOS transistor P2' and the drain of an NMOS transistor N2'. The source of the transistor P2', in turn is connected to the drain of a transistor P1'. The source of the transistor P1' is connected to the high voltage $V_{DD}$ power supply bus. The source of transistor N2' is connected to the drain of a transistor N1'. The source of the transistor N1' is connected to the low voltage $V_{SS}$ power supply bus.

The gate of the transistor N2' receives the signal P_EN# and the gate of the transistor P2' receives the signal N_EN#. The gate of the transistor P1' receives the steady voltage PBIAS. PBIAS is selected so that transistor P1' produces a particular maximum current for reasons discussed below. Likewise, the gate of the transistor N1' receives the steady voltage NBIAS, selected so that transistor N1' produces a particular maximum current. Connected between the common positive input connection of the amplifiers 22 and 24 and the output terminal pad Dx is a capacitor C1 with a particular capacitance.

The operation of the output buffer 20 is as follows. When the data to be outputted is logic '0', the signal N_EN# is a logic '0' and the signal P_EN# is a logic '0'. As a result, amplifier 22 is disabled because it does not receive a high voltage of signal P_EN#. P3' is on and maintains the voltage on the gate of P4' at a high level. Thus P4' remains off. N2' is off but P2' is on. Therefore, P1' and P2' maintain the charge on C1 at a high voltage level (which is less than $V_{DD}$). The high voltage level of C1, also inputted to the positive input of amplifier 24 exceeds the voltage level inputted to the negative input of amplifier 24 (on signal CNTR). Thus, amplifier 24 outputs a positive voltage level to the gate of N4'. N3' is off and does not drive the gate of N4'. As such, N4' remains on and maintains the voltage of the output terminal pad Dx at a low voltage level $V_{SS}$.

Now consider the case where a logic '1' is to be outputted. Both P_EN# and N_EN# are logic '1'. Amplifier 24 is disabled because it does not receive a low voltage of signal N_EN#. N3' is on and drives the gate of N4' thereby maintaining the voltage level of the gate of N4' at a low level. As such N4' remains off. P2' is off and N2' is on. As such, N1' and N2' maintain the charge on C1 at a low voltage level (which is greater than $V_{SS}$). This low voltage level, in turn, is inputted to the positive input of the amplifier 22. Because the low voltage level is less than the voltage level received at the negative input of the amplifier 22 (i.e., supplied by the signal CNTR), the amplifier 22 outputs a low or negative voltage. P3' is off and does not drive the gate of P4'. Since the gate of P4' receives only the low voltage of the amplifier 22, P4' remains on and maintains the voltage of the output terminal at a high voltage level $V_{DD}$.

Consider now a transition in logic value from '0' to '1'. In such a case, both P_EN# and N_EN# transition in logic value from '0' to '1'. P3' turns off, N3' turns on and amplifier 24 turns off. As such, N4' turns off quickly. P2' turns off and N2' turns on. Thus, N1' and N2' gradually discharge the capacitor C1. Capacitor C1 discharges over a delay period. As C1 discharges, the voltage applied to the positive inputs of the amplifiers 22 and 24 decreases and the voltage outputted from the amplifier 22 gradually decreases. This causes P4' to gradually turn on. As P4' turns on, it gradually charges the output terminal pad Dx to a high voltage.

Consider now a transition in logic value from '1' to '0'. In such a case, both P_EN and N_EN transition in logic value from '1' to '0'. This causes N3' to turn off, P3' to turn on and amplifier 22 to turn off. As such, P4' turns off quickly. P2' turns on and N2' turns off. As a result, P2' and P1' begin to charge C1 over a delay period. As C1 charges, the voltage supplied to the positive inputs of the amplifier 22 gradually increases. This causes the voltage outputted from the amplifier 22 to increase gradually, which output voltage, in turn, gradually turns on N4'. As N4' turns on, it gradually discharges the output terminal pad Dx to a low voltage.

Thus, the low speed output buffer 20 has an advantage of a gradual transition thereby reducing ground bounce and stabilizing the rise and fall times of the output terminal pad. The output buffer 20, however, has two disadvantages. First, the capacitor C1 is difficult to implement in an IC. Because the voltage of the two terminals of C1 is neither at $V_{DD}$ or $V_{SS}$, the capacitor C1 must be implemented from two separate layers of polycrystalline silicon separated by a dielectric layer, especially when C1 must remain within precise tolerances. Thus, the output buffer 20 is more expensive and complex. Second, the output buffer 20 has a high power consumption.

Recently, a new standard called the Universal Serial Bus (USB), was approved for computer equipment peripherals. According to USB, devices can communicate data at a full speed of 12 Mbit/sec or a low speed of 1.5 Mbit/sec. The USB standard specifies precise rise and fall rates of output voltage levels of USB compliant devices of about 4–20 nsec for full speed data communication but only 75–300 nsec for low speed communication. This presents a problem for ground bounce suppressing output buffers which are typically designed with slew rates for only a single particular data communication rate.

It is an object of the present invention to overcome the disadvantages of the prior art.

It is another object of the present invention to provide an output buffer that can operate at a full speed or a low speed yet suppress short circuit current and ground bounce.

SUMMARY OF THE INVENTION

These and other objects are achieved according to the present invention. According to one embodiment, an output buffer is provided which receives an input signal for output onto an output terminal. The output buffer has a first driver and a second driver for driving the output terminal to a voltage corresponding to a logic value of the input signal. The second driver has a higher driving capacity than the first driver. The output buffer also has control circuitry receiving a transition in logic value of the input signal and at least one mode signal. The control circuitry responds to the transition in logic value by delaying the second driver from driving the output terminal to a complementary voltage until after the first driver begins to drive the output terminal to the complementary voltage. In so doing, the control circuitry delays the second driver by a first delay, when the mode signal(s) indicates a full speed mode. On the other hand, the control circuitry delays the second driver by a second delay, that is longer than the first delay, when the mode signal(s) indicates a low speed mode.

Illustratively, the control circuitry includes two delay circuits. A first delay circuit causes the second driver to delay driving the output terminal to the complementary voltage by the first delay. A second delay circuit causes the second driver to delay driving the output terminal to the complementary voltage by the second delay. For example, the second delay circuit may include a first inverter with an output, a second inverter having an input connected to the output of the first inverter and a capacitor connected between the output of the first inverter and a low voltage power supply bus. A transition in logic value of the input signal causes the first inverter to transition the drive of its output. However, the capacitor delays the transition from propagating to the input of the second inverter as it charges up or discharges.

DETAILED DESCRIPTION OF THE INVENTION

Figure 1:
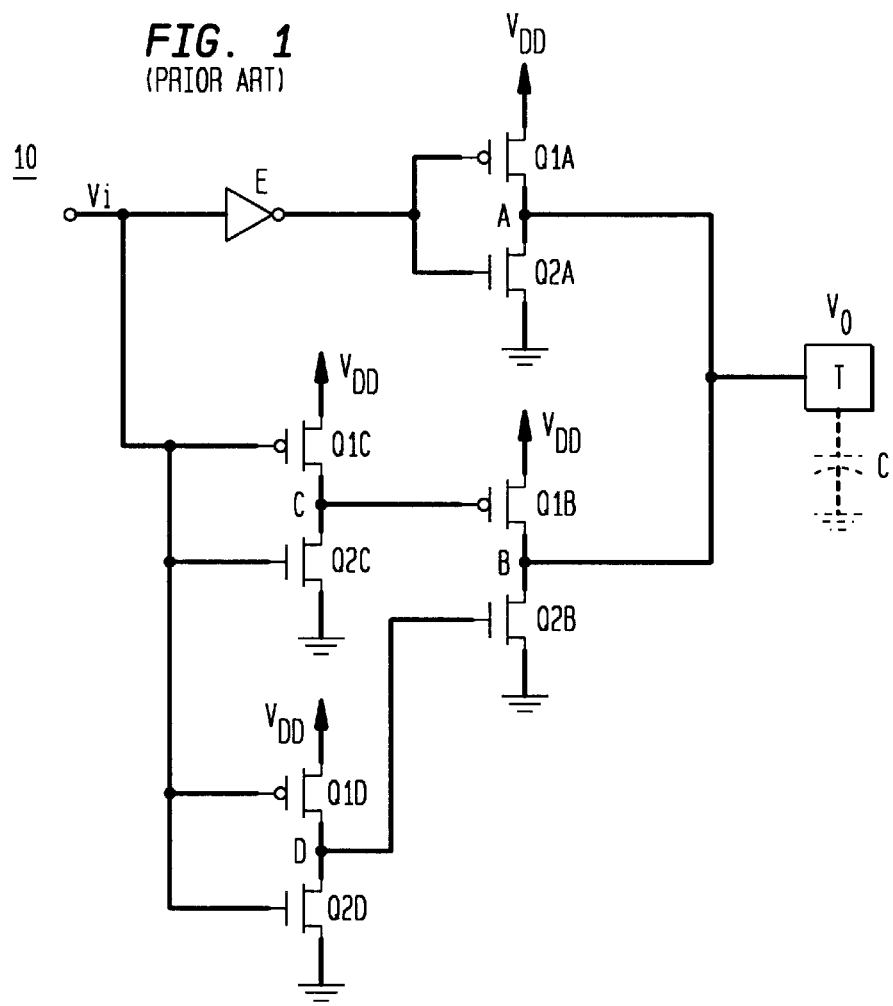
FIG. 1 shows a first conventional output buffer.
Figure 2:
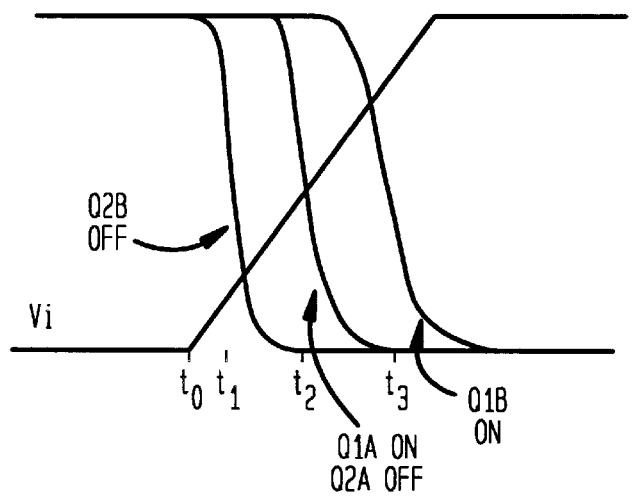
FIG. 2 shows a conventional voltage plot for the output buffer of FIG. 1.
Figure 3:
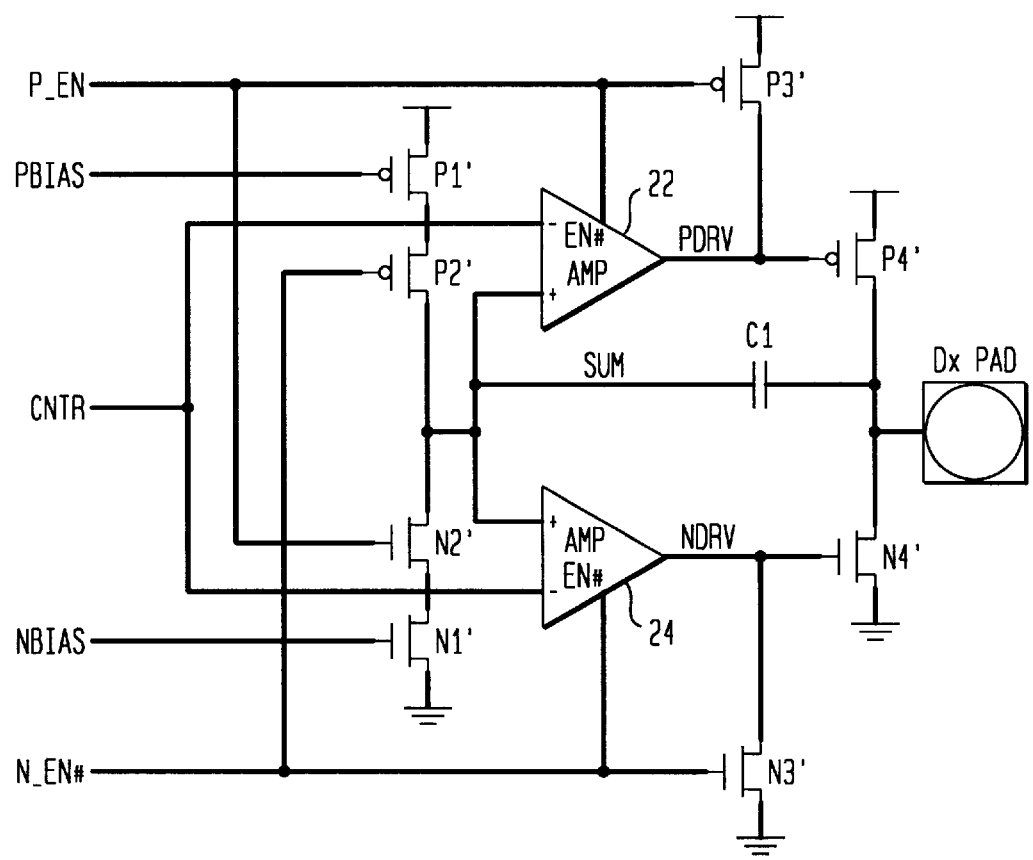
FIG. 3 shows a second conventional output buffer.
Figure 4:
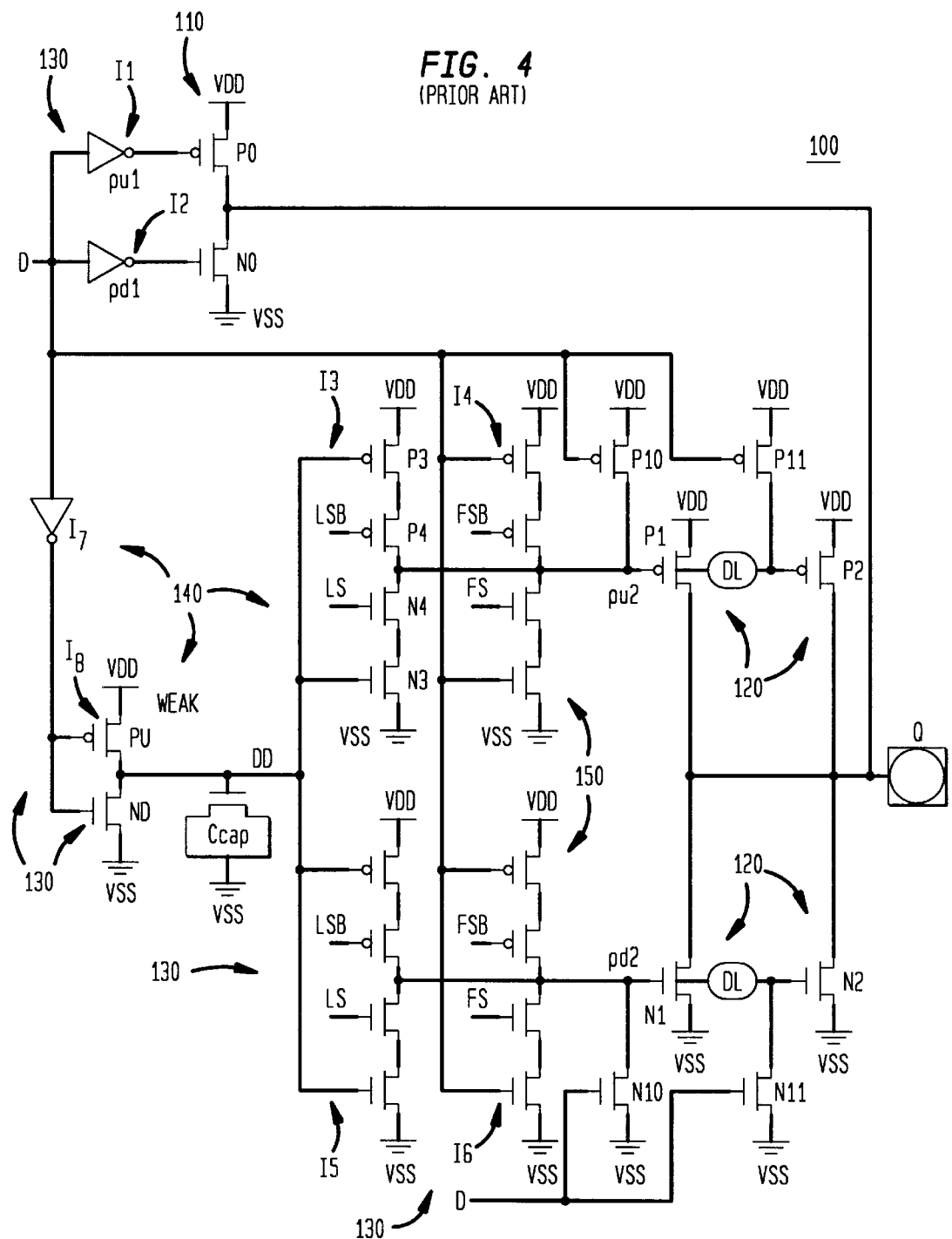
FIG. 4 shows an output buffer according to one embodiment of the present invention.

FIG. 4 shows an output buffer 100 according to an embodiment of the present invention. The output buffer 100 has two drivers, namely, a (relatively) low current drive driver 110 and a high current drive driver 120. Illustratively, the driver 110 produces about 20% of the total current drive whereas the driver 120 produces about 80% of the total current drive.

The driver 110 includes PMOS transistor P0 having a source connected to a high voltage $V_{DD}$ power supply bus and a drain connected to an output terminal pad Q. The driver 110 also includes NMOS transistor N0 having a source connected to a low voltage $V_{SS}$ power supply bus and a drain connected to an output terminal pad Q.

The driver 120 includes two PMOS transistors P1 and P2 and two NMOS transistors N1 and N2. The sources of P1 and P2 are connected to the high voltage $V_{DD}$ power supply bus. The sources of the transistors N1 and N2 are connected to the low voltage $V_{SS}$ power supply bus. The drains of the transistors P1, P2, N1 and N2 are connected to the output terminal pad Q. The gate of the transistor P1 is connected to the gate of the transistor P2 via a delay element DL. The gate of the transistor N1 is connected to the gate of the transistor N2 via a delay element DL. The delay element DL may be formed from inverters or resistors. For example, it is known to form the delay element DL as a simple extension of the resistive polycrystalline silicon gate of the transistor P1 to the transistor P2 or the transistor N1 to the transistor N2. The purpose of the delay elements DL is to delay the propagation of a turn on signal from the gate of N1 or P1 to the gate of P2 or N2, respectively. As a result, when a low voltage signal is applied to the gate of P1, P1 turns on first and P2 turns on after some delay caused by the delay element DL connected between P1 and P2. Likewise, when a high voltage signal is applied to the gate of N1, N1 turns on first and N2 turns on after some delay caused by the delay element DL connected between N1 and N2. This gradual turn-on of the transistors P1–P2 or N1–N2 tends to suppress ground bounce.

On the other hand it is desirable to turn off the transistors P1 and P2 or N1 and N2 rapidly. To that end, PMOS transistors P10 and P11 are provided with their sources connected to the high voltage $V_{DD}$ power supply bus and their drains connected to the gates of P1 and P2, respectively. The gates of transistors P10 and P11 both receive the input signal D. When it is desirable to turn off transistors P1 and P2, (i.e., when outputting a logic '0' from output terminal Q) input signal D (having a logic value of '0') turns on P10 and P11 which quickly charge up the gates of P1 and P2, thereby turning them off.

Likewise NMOS transistors N10 and N11 are provided with their sources connected to the low voltage $V_{SS}$ power supply bus and their drains connected to the gates of transistors N1 and N2, respectively. The gates of N10 and N11 receive the input signal D. When it is desirable to turn off the transistors N1 and N2 (i.e., when outputting a logic '1' from output terminal Q) input signal D (having a logic value of '1') turns on N10 and N11 which quickly discharge the gates of N1 and N2, thereby turning them off.

Control circuitry 130 is also provided for predriving the drivers 110 and 120. In the case of the driver 110, the control circuitry 130 includes two predriver inverters I1 and I2. The gate of P0 is connected to an output of predriver inverter I1. The gate of N0 is connected to an output of predriver inverter I2. An input of inverter I1 and an input of inverter I2 both receive an input data signal D in parallel.

In the case of the driver 120, the control circuitry 130 includes two delay circuits 140 and 150. The delay circuit 140 includes inverters I7 and I8, capacitor Cap and two parallel connected tri-state inverters I3 and I5. The input signal D is received at inverter I7 which outputs the complement of input signal D to inverter I8. As shown, inverter I8 is formed from PMOS transistor PU and NMOS transistor ND connected in a push-pull configuration. The output of inverter I8 is connected to a node DD. As shown, capacitor Cap is connected between node DD and the low voltage $V_{SS}$ power supply bus.

Also connected to the node DD are the inputs of tri-state inverters I3 and I5. Each tri-state inverter I3 and I5 has a similar construction. For example, the inverter I3 includes a PMOS transistor P3 having a source connected to the high voltage $V_{DD}$ power supply bus, and a gate connected to the input of tri-state inverter I3. The drain of P3 is connected to the output of the tri-state inverter I3 via PMOS transistor P4. The inverter I3 also includes an NMOS transistor N3 having a source connected to the low voltage $V_{SS}$ power supply bus, and a gate connected to the input of tri-state inverter I3. The drain of N3 is connected to the output of inverter I3 via NMOS transistor N4. Transistors P4 and N4 each receive complementary enabling signals, namely, LSB and LS, respectively (described in greater detail below). When LSB is a logic '0' value and LS is a logic '1' value, the transistors P4 and N4 permit the transistors P3 and N3 to drive the output of tri-state inverter I3. However, when LSB is a logic '1' value and LS is a logic '0' value, the signals generated by P3 and N3 are blocked from reaching the output of the inverter I3.

Like the tri-state inverter I3, the tri-state inverter I5 receives the same complementary enabling signals LSB and LS. The output of the tri-state inverter I3 is connected to the gate of transistor P1. The output of inverter I5 is connected to the gate of transistor N1.

The delay circuit 150 includes only the tri-state inverters I4 and I6. Each of tri-state inverters I4 and I6 has a similar construction as the tri-state inverters I3 and I5. Each tri-state inverter I4 and I6 has an input which receives the input signal D. The output of the tri-state inverter I4 is connected to the gate of transistor P1. The output of the tri-state inverter I6 is connected to the gate of transistor N1. Unlike the tri-state inverters I3 and I5, the tri-state inverters I4 and I6 receive the enabling signals FSB and FS, where FSB is the complement of FS.

The inverters I1, I3 and I4 are designed to have a logic threshold (switching voltage) in excess of $(V_{DD}-V_{SS})/2$. The inverters I2, I5 and I6 are designed to have a logic threshold less than $(V_{DD}-V_{SS})/2$. Illustratively, $V_{SS}=0$ volts and $V_{DD}$ is 3.0 to 3.6 volts. Thus, $(V_{DD}-V_{SS})/2=V_{DD}/2$.

The signals LS and FS are mode signals indicating whether the output buffer is to operate in low speed or full speed mode, respectively. During low speed mode operation, an output buffer in a USB compliant hub or other IC would output data at 1.5 Mbit/sec. During full speed mode operation, the output buffer would output data at 12 Mbit/sec. However, these low and full speeds are merely illustrative.

The steady-state operation of the output buffer 100 is first described. When input signal D=0, the inverters I1, I2, I7, I3, I5, I4 and I6 output logic value '1' (and inverter I8 outputs logic value '0'). As such, transistors P0, P1 and P2 are off and transistors N0, N1 and N2 are on. The transistors N0, N1 and N2 provide the current drive (current sink) to output terminal pad Q thereby maintaining its voltage level at the same level as the low voltage power supply bus, namely, $V_{SS}$. On the other hand, when input signal D=1, the inverters I1, I2, I7, I3, I5, I4 and I6 output logic value '0' (and inverter I8 outputs logic value '1'). As such, transistors N0, N1 and N2 are off and transistors P0, P1 and P2 are on. The transistors P0, P1 and P2 provide current drive (current supply or surge) to the output terminal pad Q thereby maintaining its voltage level at the same voltage level as the high voltage power supply bus, namely, $V_{DD}$.

Figure 5:
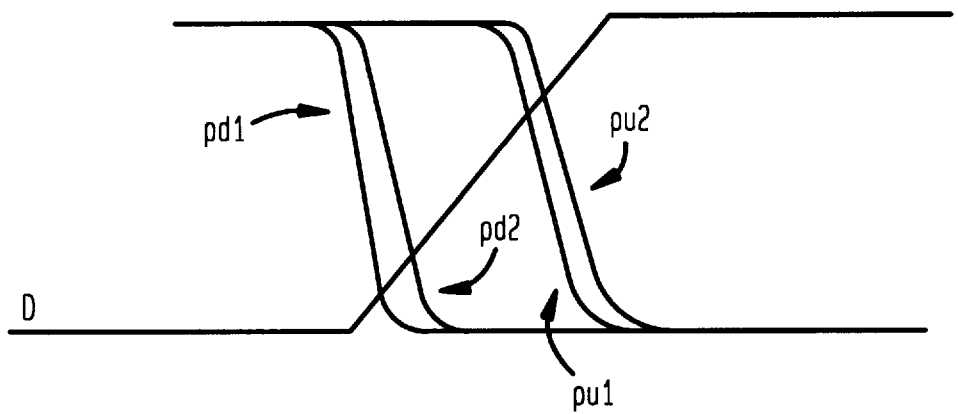
FIG. 5 shows a full speed operation transition in control signals.

Transient operation is now described with reference to FIGS. 5 and 6. Consider first the full speed mode of operation depicted in FIG. 5. During full speed mode operation, FSB='0', FS='1', LSB='1' and LS='0'. As a result, inverters I3 and I5 are tri-stated and therefore disabled. However, inverters I4 and I6 are enabled. Assume that input signal D transitions its logic value from '0' to '1'. First, as the voltage of D rises, the switching thresholds of I2 and I6 are reached before D rises to $V_{DD}/2$. This causes I2 and I6 to transition their outputs pd1 and pd2 from logic '1' to logic '0', with I2 transitioning before I6. As a result, N0, N1 and N2 begin to turn off. As D continues to rise, N10 and N11 quickly turn on so as to assist in turning off N1 and N2. Eventually, D rises above $V_{DD}/2$ to the switching threshold of I1 and I4, thereby causing I1 and I4 to transition their outputs pu1 and pu2 from logic '1' to logic '0', with I1 transitioning before I4. As a result, P0, P1 and P2 begin to turn on. Note that P1 turns on before P2 by virtue of delay element DL.

Assume now that input signal D transitions its logic value from '1' to '0'. First, as the voltage of D falls, the switching thresholds of I1 and I4 are reached before D falls to $V_{DD}/2$. This causes I1 and I4 to transition their outputs pu1 and pu2 from logic '0' to logic '1', with I1 transitioning before I4. As a result, P0, P1 and P2 begin to turn off. As D continues to fall, P10 and P11 quickly turn on so as to assist in turning off P1 and P2. Eventually, D falls below $V_{DD}/2$ to the switching threshold of I2 and I6, thereby causing I2 and I6 to transition their outputs pd1 and pd2 from logic '0' to logic '1', with I2 transitioning before I6. As a result, N0, N1 and N2 begin to turn on. Note that N1 turns on before N2 by virtue of delay element DL.

Figure 6:
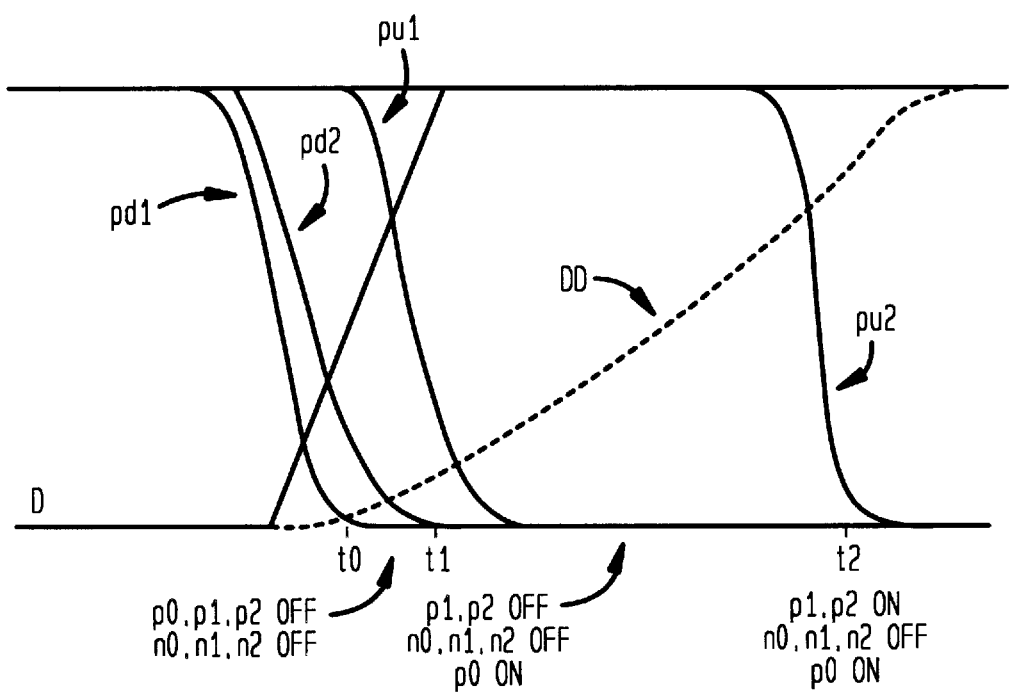
FIG. 6 shows a low speed operation transition in control signals.

Consider now the low speed mode of operation depicted in FIG. 6. During low speed mode operation, LSB='0', LS='1', FSB='1' and FS='0'. As a result, inverters I4 and I6 are tri-stated and therefore disabled. However, inverters I3 and I5 are enabled. Assume that input signal D transitions its logic value from '0' to '1'. First, as the voltage of D rises, the inverter I7 outputs a falling voltage level to I8. As the voltage inputted to inverter I8 falls, ND begins to turn off and PU begins to turn on. As a result, I8 begins to charge node DD. The charging of node DD is delayed by virtue of capacitor Cap, which must be charged up.

As the voltage of input signal D rises, the switching threshold of I2 is reached before the voltage of input signal D reaches $V_{DD}/2$. Likewise, as DD is charged up, the voltage of DD eventually reaches the switching voltage of I5 at time t0". This causes I2 and I5 to transition their outputs pd1 and pd2 from logic '1' to logic '0', with I2 transitioning before I5. As a result, N0, N1 and N2 begin to turn off. As D continues to rise, N10 and N11 quickly turn on so as to assist in turning off N1 and N2.

Eventually, D rises above $V_{DD}/2$ to the switching threshold of I1 at time t1", thereby causing I1 to transition its output pu1 from logic '1' to logic '0'. As a result, P0 begins to turn on. At this point in time, however, inverter I8 has not yet charged node DD to the switching threshold of I3. Thus, transistors P1 and P2 remain off. At a later time t2", node DD finally charges up to the switching voltage of I3. Inverter I3 transitions its output pu2 from logic '1' to logic '0'. As a result P1 and P2 begin to turn on, wherein P2 turns on after P 1 because of delay element DL.

Assume now that input signal D transitions its logic value from '1' to '0'. First, as the voltage of D falls, the inverter I7 outputs a rising voltage level to I8. As the voltage inputted to inverter I8 rises, PU begins to turn off and ND begins to turn on. As a result, I8 begins to discharge node DD. The discharging of node DD is delayed by virtue of capacitor Cap, which must be discharged.

As the voltage of input signal D falls, the switching threshold of I1 is reached before the voltage of input signal D falls to $V_{DD}/2$. Likewise, as DD is discharged, the voltage of DD eventually falls to the switching voltage of I3. This causes I1 and I3 to transition their outputs pu1 and pu2 from logic '0' to logic '1', with I1 transitioning before I3. As a result, P0, P1 and P2 begin to turn off. As D continues to fall, P10 and P11 quickly turn on so as to assist in turning off P1 and P2.

Eventually, D falls below $V_{DD}/2$ to the switching threshold of I2, thereby causing I2 to transition its output pd1 from logic '0' to logic '1'. As a result, N0 begins to turn on. At this point in time, however, inverter I8 has not yet discharged node DD to the switching threshold of I5. Thus, transistors N1 and N2 remain off. At a later time, node DD finally discharges down to the switching voltage of I5. Inverter I5 transitions its output pd2 from logic '0' to logic '1'. As a result N1 and N2 begin to turn on, wherein N2 turns on after N1 because of delay element DL.

The following key points should be noted in the operation of the output buffer 100:

(1) The small transistors N0 or P0 of the driver 110 turn on before the large transistors N1, N2 or P1, P2 of the driver 120 in both low and full speed modes of operation. This is because N1, DL and N2 serve as a larger impedance for inverters I5 or I6 than N0 serves for I2. Likewise, P1, DL and P2 serve as a larger impedance for I3 or I4 than P0 serves for I1. Because the transistors N0 and P0 are smaller than the transistors N1, N2 and P1, P2, ground bounce is reduced.

(2) Transistor P1 turns on before transistor P2 during a transition of logic '0' to logic '1' and transistor N1 turns on before transistor N2 during a logic '1' to logic '0' transition. The gradual turn on of the transistors that make up the pull-up driver or the pull-down driver substantially reduce the amount of ground bounce.

(3) During a transition in the input signal logic value, the delay between the driver 110 transitioning to the complementary voltage (corresponding to the logic value to which the input signal transitions) and the driver 120 transitioning to the complementary voltage depends on whether the full speed or the low speed mode of operation has been selected. During the full speed mode of operation, the delay is shorter than during the low speed mode of operation. This is because the delay circuit 140 includes capacitor Cap which must be charged in order to output the appropriate voltage level at pu2 or pd2 for activating P1, P2 or N1, N2. This is desirable. During full speed operation, the rise and fall times of the voltage of the output terminal Q must be shorter when a transition occurs. On the other hand, during low speed operation, the rise and fall times of the voltage level of the output terminal Q must be longer when a transition occurs. The net effect is that the transition time during low speed operation is prolonged (e.g., on the order of magnitude of one or more tens of nsec) in relation to a transition during full speed operation.

(4) The transistors P0, P1 and P2 do not begin to turn on until after the transistors N0, N1 and N2 have substantially turned off. Likewise, the transistors N0, N1 and N2 do not begin to turn on until after the transistors P0, P1 and P2 have substantially turned off. This reduces short circuit currently flowing between the high voltage $V_{DD}$ power supply bus and the low voltage $V_{SS}$ power supply bus through the transistors P0, P1 P2, N0, N1 and N2 of the drivers 110 and 120.

Advantageously, the capacitor Cap is implemented as a MOS transistor for which both the source and drain are connected to the low voltage $V_{SS}$ power supply bus. Note that the capacitance of Cap is important to fixing the transition prolongation during low speed operation. Such a capacitor Cap tends to have a higher manufacturing tolerance. Specifically, the capacitance of Cap is given by $\epsilon_{ox} \bullet \text{Area}/t_{ox}$ where $\epsilon_{ox}$ is the permitivity of the gate oxide of Cap, $t_{ox}$ is the thickness of the gate oxide and Area is the area of the polycrystalline silicon gate that serves as a plate of Cap. Note that $t_{ox}$ is not perfectly. If $t_{ox}$ is thinner than originally designed, then the capacitance of Cap will increase. However, the current driving strength of PU and ND will also increase. Likewise, if $t_{ox}$ is thicker, then the capacitance of Cap will decrease but so will the current drive capability of PU and ND. Thus, such a capacitor is somewhat process variation self compensating.

Figure 7:
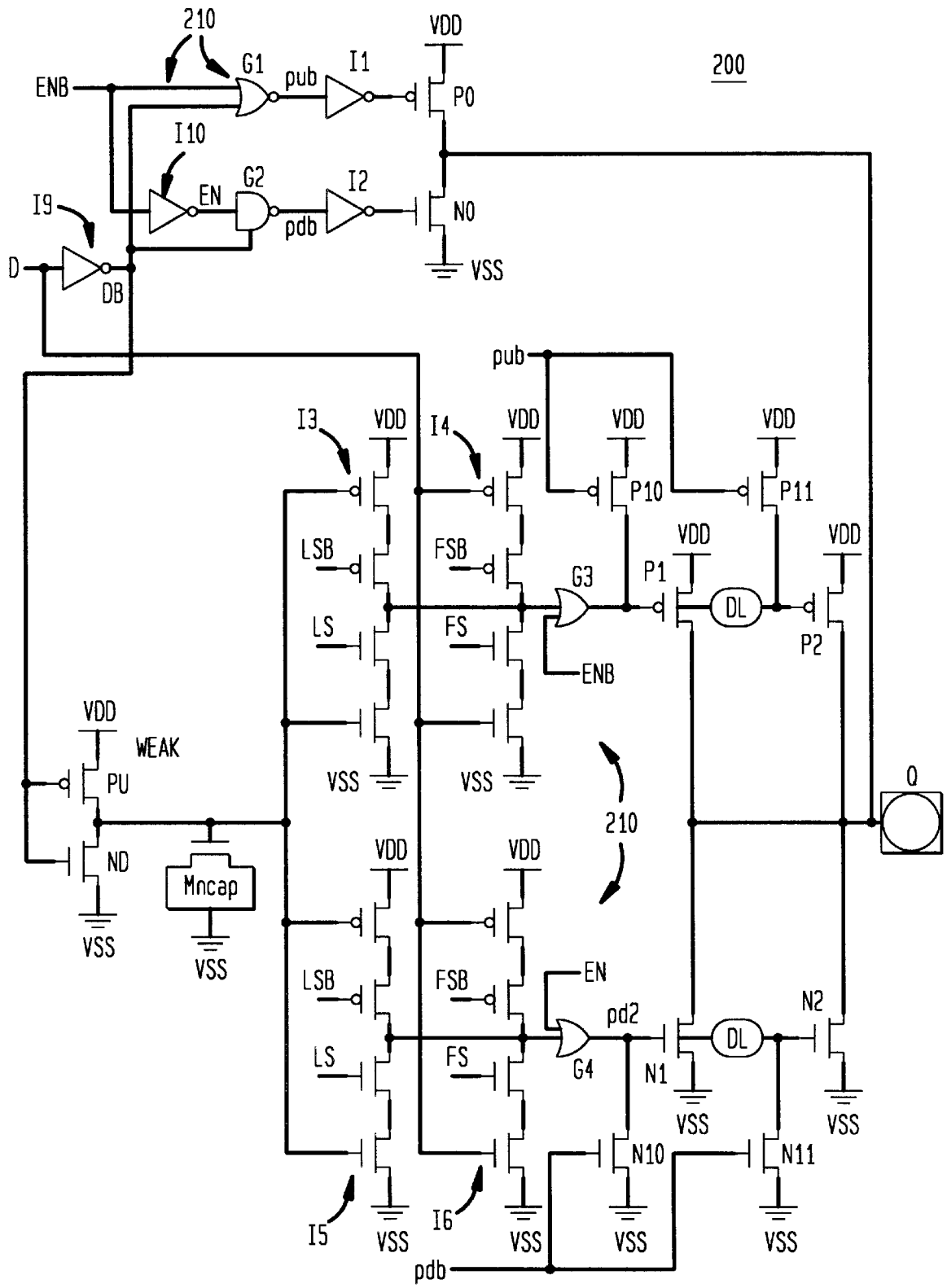
FIG. 7 shows an output buffer according to another embodiment of the present invention.

FIG. 7 shows an output buffer 200 according to a second embodiment of the present invention. The output buffer 200 is very similar to the output buffer 100. Therefore, only the differences between this output buffer 200 and the output buffer 100 are described. The output buffer 200 has enable circuitry 210 in the form of logic gates G1, G2, G3 and G4 which receive one or more enable signals EN, ENB, where ENB is the complement of EN. The input signal D is inputted to an inverter I9 to produce a complement of the input signal DB. The logic NOR gate G1 has one input that receives the signal DB and a second input that receives the signal ENB The output of NOR gate G1 is connected to the input of inverter I1. Logic NAND gate G2 has one input receiving EN (which may be generated by inverter I10, as shown) and one input receiving DB. The output of NAND gate G2 is connected to the input of inverter I2. Logic OR gate G3 has one input connected to the outputs of inverters I3 and I4 and one input receiving ENB. The output of OR gate G3 is inputted to P1 and P2 (via DL). Logic AND gate G4 has one input connected to the outputs of inverters I5 and I6 and one input receiving EN. The output of AND gate G4 is connected to the inputs of N1 and N2 (via DL).

When EN=1 and ENB=0, the output buffer 200 is enabled. Specifically, the outputs of gates G1, G2, G3 and G4 will depend on the logic value of input signal D and will be the same as input signal D. When EN=0 and ENB=1, however, the output buffer 200 is disabled. The outputs of logic gates G1 and G3 will be logic '0' and '1', and the outputs of logic gates G2 and G4 will be logic '1' and '0', regardless of the logic value of input signal D. Such outputs will cause all of the transistors N0, N1 N2, P0, P1 and P2 to remain off.

Figure 8:
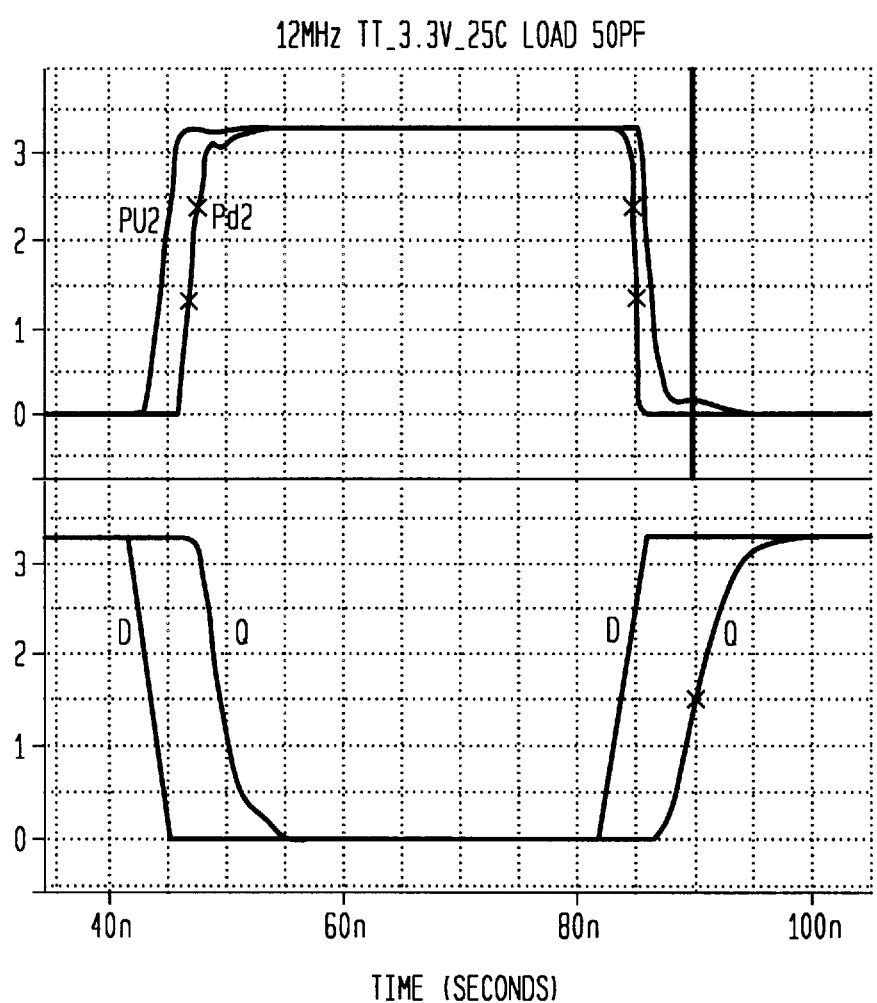
FIG. 8 shows a plot of control and output signal transitions of a simulated circuit during full speed operation.
Figure 9:
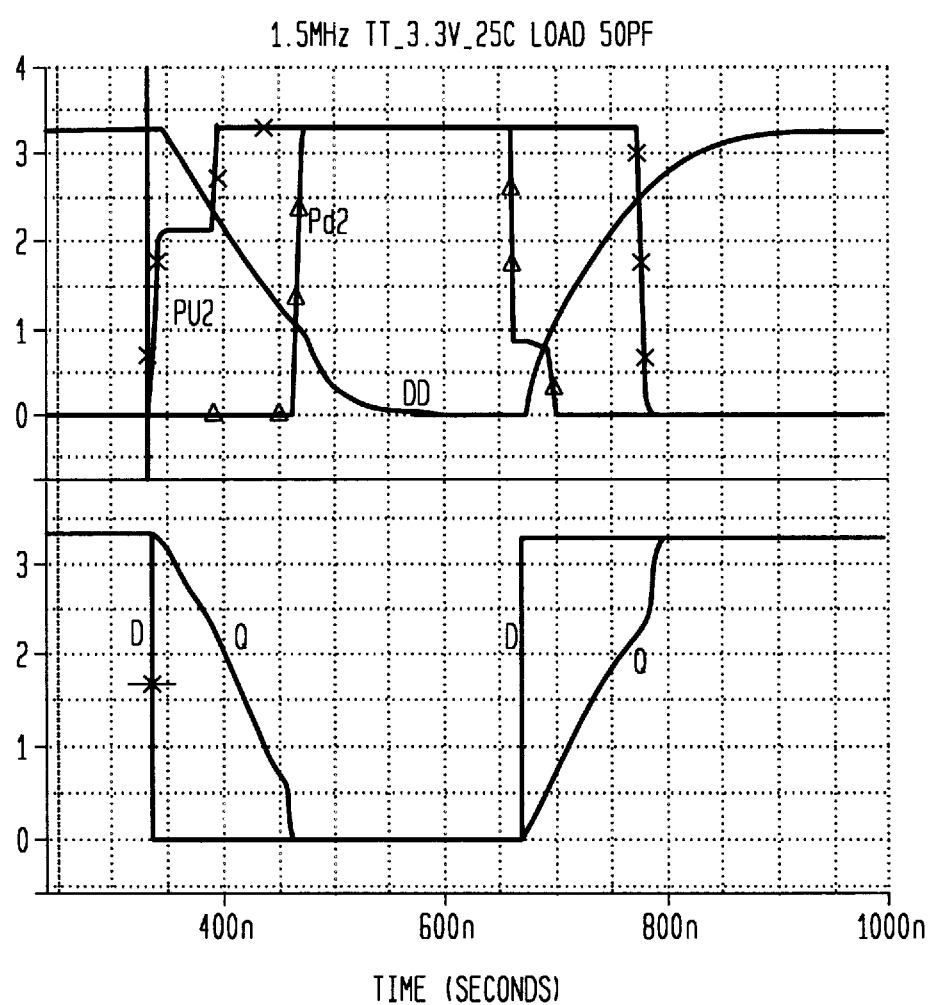
FIG. 9 shows a plot of control and output signal transitions of a simulated circuit during low speed operation.

Finally, FIGS. 8 and 9 present plots for a simulated circuit using the design principles of the output buffers 100 and 200 according to the present invention (1200 μm channel width for total PMOS and 512 μm for total NMOS, respectively). The various PMOS and NMOS transistor parameters are selected to achieve full speed and low speed data communication according to the following USB specifications:

TABLE 1

|  | full speed | low speed |
| --- | --- | --- |
| rise time fall time | 4–20 nsec (90%–110%) | 75–300 nsec (70%–130%) |
| delay | 0–12 nsec (50 pF load) | <300 nsec (50–350 pF load) |
| data rate | 12 Mbits/sec | 1.5 Mbits/sec |

FIG. 8 shows a plot for full speed operation and FIG. 9 shows a plot for low speed operation. Tables 2 and 3 summarize the results for best, typical and worst high voltage levels $V_{DD}$, operating temperatures and permissible loads.

TABLE 2

Full Speed

| Parameter | Best | Typical | Worst |
| --- | --- | --- | --- |
| $V_{DD}$ | 3.6 volts | 3.3 volts | 3.0 volts |
| Temperature | 0° C. | 25° C. | 85° C. |
| Load | 50 pF | 50 pF | 50 pF |
| Fall time | 4.5 nsec | 5.5 nsec | 7.2 nsec |
| Rise time | 4.8 nsec | 6.0 nsec | 7.9 nsec |
| Delay | 4.5 Nsec | 5.9 nsec | 9.5 nsec |

TABLE 3

Low Speed

| Parameter | Best | Typical | Worst |
| --- | --- | --- | --- |
| $V_{DD}$ | 3.6 volts | 3.3 volts | 3.0 volts |
| Temperature | 0° C. | 25° C. | 85° C. |
| Load | 50 pF | 50 pF | 350 pF |
| Fall time | 75 nsec | 101.2 nsec | 122.2 nsec |
| Rise time | 75.5 nsec | 101.2 nsec | 102.6 nsec |
| Delay | 54.8 nsec | 73.6 nsec | 206.4 nsec |

As shown, the output buffer according to the present invention meets the USB specification operating requirements.

The above discussion is intended to be merely illustrative of the invention. Those having ordinary skill in the art may devise numerous alternative embodiments without departing from the spirit and scope of the following claims.

The claimed invention is:

1. An output buffer comprising:

an input signal, an output terminal, a first driver for driving said output terminal to a voltage corresponding to a logic value of said input signal, a second driver, having a higher driving capacity than said first driver, for driving said output terminal to a voltage corresponding to said logic value of said input signal, control circuitry receiving a transition in logic value of said input signal and at least one mode signal, said control circuitry responding to said transition in logic value by delaying said second driver from driving said output terminal to a complementary voltage until after said first driver begins to drive said output terminal to said complementary voltage, wherein said control circuitry delays said second driver by a first delay, when said at least one mode signal indicates a full speed mode, and by a second delay that is longer than said first delay, when said at least one mode signal indicates a low speed mode.

2. The output buffer of claim 1 wherein said control circuitry comprises:

a first delay circuit receiving said input signal and at least one mode signal, and outputting one or more enable signals for enabling said second driver to drive said output terminal to one of plural voltages, but only when said at least one mode signal indicates said full speed mode, said first delay circuit responding to said logic value transition of said input signal by, after said first delay, enabling said second driver to drive said output terminal to said complementary voltage, and a second delay circuit receiving said input signal and at least one mode signal, and outputting one or more enable signals for enabling said second driver to drive said output to one of plural voltages, but only when said at least one mode signal indicates said low speed mode, said second delay circuit responding to said logic value transition of said input signal by, after said second delay, enabling said second driver to drive said output terminal to said complementary voltage.

3. The output buffer of claim 2 wherein said second delay circuit comprises:

a first inverter with an output, a second inverter having an input connected to said output of said first inverter, and a capacitor connected between said output of said first inverter and a low voltage power supply bus.

4. The output buffer of claim 3 wherein when said first inverter drives said first inverter output to a high voltage, said capacitor charges up so as to delay a rise of a voltage level of said first inverter output and so as to delay a change in drive of said second inverter.

5. The output buffer of claim 3 wherein said capacitor is a MOS transistor having a gate connected to said first inverter output, a source connected to said low voltage power bus and a drain connected to said low voltage power bus.

6. The output buffer of claim 1 wherein said first driver comprises a first pull-up driver for driving said output terminal to a high voltage and a first pull-down driver for driving said output terminal to a low voltage, said output buffer further comprising:

a first predriver pull-up inverter receiving said input signal and outputting a complement of said first signal to said input pull-up driver, and a first predriver pull-down inverter receiving said input signal and outputting a complement of said input signal to said first pull-down driver, wherein said first predriver pull-up inverter has a switching voltage greater than half of a difference between a high biasing voltage and a low biasing voltage of said first predriver pull-up and pull-down inverters, and said first predriver pull-down inverter has a switching voltage less than half of said difference between said high biasing voltage and said low biasing voltage of said first predriver pull-up and pull-down inverters, so as to reduce a short circuit current flowing through said first pull-up and pull-down drivers when said first predriver pull-up and pull-down inverters receive said transition in logic value of said input signal.

7. The output buffer of claim 6 wherein said first pull-up driver comprises a PMOS transistor and said first pull-down predriver comprises an NMOS transistor.

8. The output buffer of claim 1 wherein said second driver comprises a pull-up driver for driving said output terminal to a high voltage and a pull-down driver for driving said output at least one pull-up inverter for enabling said pull-up driver to drive said output terminal to a high voltage in response to a first value of said input signal, and at least one pull-down inverter for enabling said pull-down driver to drive said output terminal to a low voltage in response to a second logic value of said input signal, wherein said at least one pull-up inverter has a switching voltage that is greater than one half of a difference between a high biasing voltage and a low biasing voltage of said at least one pull-up inverter and said at least one pull-down inverter, and wherein said at least one pull-up inverter has a switching voltage that is less than one half of said difference between said high biasing voltage and said low biasing voltage of said at least one pull-up inverter and said at least one pull-down inverter, so as to reduce a short circuit current flowing through said pull-up and pull-down drivers when input signal transitions in logic value.

9. The output buffer of claim 1 wherein said second driver comprises:

a first MOS transistor, having an input connected to an output of said control circuitry, a second MOS transistor, and a first delay element connected between said gate of said first MOS transistor and said second MOS transistor so as to delay a turn on of said second MOS transistor with respect to said first MOS transistor.

10. The output buffer of claim 9 further comprising:

at least one quick turn off MOS transistor having a gate receiving said input signal, a source connected to a particular power supply bus and a drain connected to one of said MOS transistors of said second driver for driving said gate of said MOS transistor of said second driver to a voltage of said power supply bus to speed up a turn off of said MOS transistor of said second driver.

11. The output buffer of claim 1 further comprising:

enable circuitry connected between at least one output of said control circuitry and at least one input of said second driver, said enable circuitry receiving at least one enable signal and responding to an enable indication of said enable signal by enabling said control circuitry to output signals for activating said second driver, said enable circuitry also responding to a disable indication of said enable signal by preventing said control circuitry form activating said second driver.

12. The output buffer of claim 11 wherein said enable circuitry comprises at least one logic gate which each receives one of said at least one enable signal, each of said at least one logic gate responding to said disable indication by outputting a particular logic value, regardless of said logic value of said input signal, which turns off said second driver, and responding to an enable indication by outputting a logic value that depends solely on a logic value of said input signal.

13. The output buffer of claim 11 further comprising:

second enable circuitry receiving said input signal and a first one of said at least one enable signal, said enable circuitry enabling said input signal to activate said first driver in driving said output to a voltage corresponding to said input signal in response to an enable indication of said first one of said at least one enable signal and preventing said input signal from activating said first driver in driving said output in response to a disable indication of said first one of said at least one enable signal.

14. The output buffer of claim 13 further comprising:

at least one predriver connected between at least one output of said second enable circuitry and at least one input of said first driver, wherein said second enable circuitry comprises at least one logic gate receiving said input signal and said first one of said at least one enable signal, each of said at least one logic gate of said second enable circuitry responding to a disable indication of said first one of said enable signal by outputting a particular logic value, regardless of said logic value of said input signal, which causes said predriver to turn off said first driver, and responding to an enable indication of said enable signal by outputting a logic value that depends solely on a logic value of said input signal.

* * * * *

UNITED STATES PATENT AND TRADEMARK OFFICE
CERTIFICATE OF CORRECTION

PATENT NO : 5,850,159
DATED : December 15, 1998
INVENTOR(S) : Hwang-Cherng CHOW, et al.

It is certified that error appears in the above-identified patent and that said Letters Patent is hereby corrected as shown below:

The title page:

The Assignee should read:
Industrial Technology Research Institute

Signed and Sealed this

Twenty-third Day of November, 1999

Attest:

Q. TODD DICKINSON

*Attesting Officer*  *Acting Commissioner of Patents and Trademarks*